(12) United States Patent
Coleman et al.

(10) Patent No.: US 6,317,445 B1
(45) Date of Patent: Nov. 13, 2001

(54) FLARED AND TAPERED RIB WAVEGUIDE SEMICONDUCTOR LASER AND METHOD FOR MAKING SAME

(75) Inventors: James J. Coleman, Monticello, IL (US); Mark S. Zediker, Bridgeton, MO (US)

(73) Assignee: The Board of Trustees of the University of Illinois

( * ) Notice: Subject to any disclaimer, the term of this patent is extended or adjusted under 35 U.S.C. 154(b) by 0 days.

(21) Appl. No.: 09/547,302

(22) Filed: Apr. 11, 2000

(51) Int. Cl.[7] .................................................. H01S 5/20
(52) U.S. Cl. ................................................... 372/45
(58) Field of Search ............................. 372/45, 46

(56) References Cited

U.S. PATENT DOCUMENTS

| 5,602,864 | 2/1997 | Welch et al. | 372/50 |
| 5,763,287 | 6/1998 | Itagaki et al. | 457/126 |
| 5,937,120 | * 8/1999 | Higashi | 385/49 |

* cited by examiner

Primary Examiner—James W. Davie
(74) Attorney, Agent, or Firm—Greer, Burns & Crain, Ltd.

(57) ABSTRACT

A semiconductor laser structure based upon a rib waveguide geometry which includes a uniform region and a flared and tapered region. The uniform region has a generally constant thickness and width. The flared tapered region gradually increases in width and decreases in thickness from the uniform region to a wide end. Fabrication is by selective area epitaxy with dielectric stripes in a dual stripe dielectric mask used to defined the two dimensional varying flare in the waveguide changing in thickness as a function of the flare width.

6 Claims, 2 Drawing Sheets

FLARED AND TAPERED RIB WAVEGUIDE SEMICONDUCTOR LASER AND METHOD FOR MAKING SAME

FIELD OF THE INVENTION

The present invention generally concerns semiconductor lasers.

BACKGROUND OF THE INVENTION

Semiconductor lasers are the fundamental building block in compact optic and optoelectronic devices. Formed from Group III–V semiconductors, the semiconductor lasers emit laser light in response to electrical stimulation as electrons relax back to lower energy states and emit photons. High brightness semiconductor lasers are generally single mode waveguide structures that are limited to a few hundred milliwatts.

Higher power devices are desirable. However, prior efforts to increase the power of conventional devices have met limited success. Tapered waveguide structures have been successful in extending power output to a few watts. Since the conventional semiconductor lasers are generally free expansion devices with no control over the position of the beam waist, the change in current used to effect the higher power has typically caused the beam waist to move around. This is undesirable since it causes the beam position to wander in the far field as well as the beam size.

Other devices such as the master oscillator power amplifier (MOPA) use a distributed Bragg grating to define a master oscillator, and the tapered section of the waveguide serves is a power amplifier. Such a device is difficult to fabricate and is not easily integrated into linear arrays of devices. These conventional attempts also tend to demonstrate a strong astigmatism that is often uncontrolled.

Accordingly, there is a need for an improved semiconductor laser structure. It is an object of the invention to provide such a structure to address some or all of the aforementioned drawbacks.

SUMMARY OF THE INVENTION

Such a need is met or exceeded by the present semiconductor laser structure and method for producing the structure. In the structure of the present invention, the geometry of the semiconductor laser is based upon a rib waveguide which includes a uniform region and a tapered region. The uniform region has a generally constant thickness and width. The tapered region gradually increases in width and decreases in thickness from the uniform region to a flared end. Fabrication is by selective area epitaxy with dielectric stripes in a dual stripe dielectric mask used to defined the two dimensional varying flare in the waveguide, changing in thickness as a function of the flare width.

BRIEF DESCRIPTION OF THE DRAWINGS

Other objects, features, and advantages of the invention will be apparent to those skilled in the art by reference to the detailed description and the figures, of which.

DETAILED DESCRIPTION OF THE PREFERRED EMBODIMENTS

Devices of the invention include a flared and tapered rib-loaded waveguide, with a reduction in thickness toward a flared end, or dual flared ends, of the waveguide being a function of an increase in width. The invention is applicable to semiconductor lasers having a general structure like that shown in FIG. 1.

Figure 1:
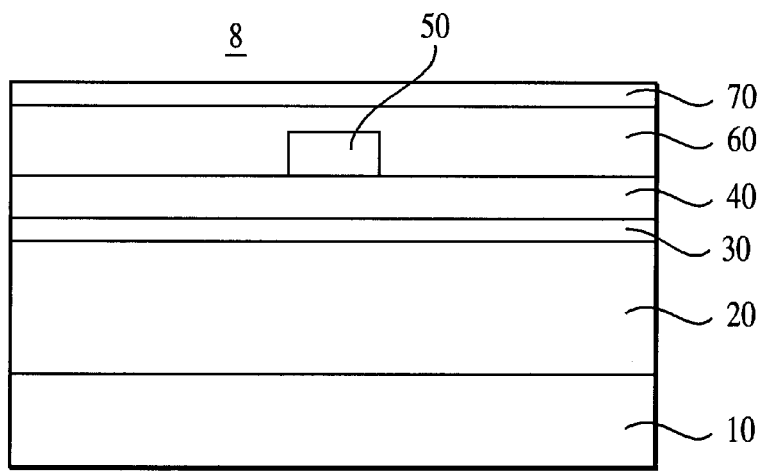
FIG. 1 shows the general structure of a rib loaded waveguide diode laser to which the present invention is applicable.

A cross section of a rib-loaded waveguide laser 8 is shown in FIG. 1. The rib-loaded waveguide laser 8 includes a substrate 10 suitable for selective area epitaxy laser device growth. A layer on the substrate 10 is, for example, a lower wide-gap transverse waveguide outer confining layer 20. The next layer is a composite active region 30, typically consisting of a quantum well or wells and appropriate inner barrier layers. Two layers 40 and 60 serve as the upper wide-gap transverse waveguide outer confining layer. The layers 40 and 60 may have the same or different material compositions. A contact layer 70 typically is a heavily-doped narrow gap layer suitable for formation of high quality ohmic contacts. The selectively grown or etched rib loading layer 50 is designed to have a narrower bandgap than the confining layers 20, 40 and 60, thus, a higher refractive index. Tailoring dimensions of the rib layer 50, such as the thickness, width, and separation and composition, is used to raise the effective refractive index in the central, or core, region, resulting in a lateral slab dielectric waveguide.

Figure 2:
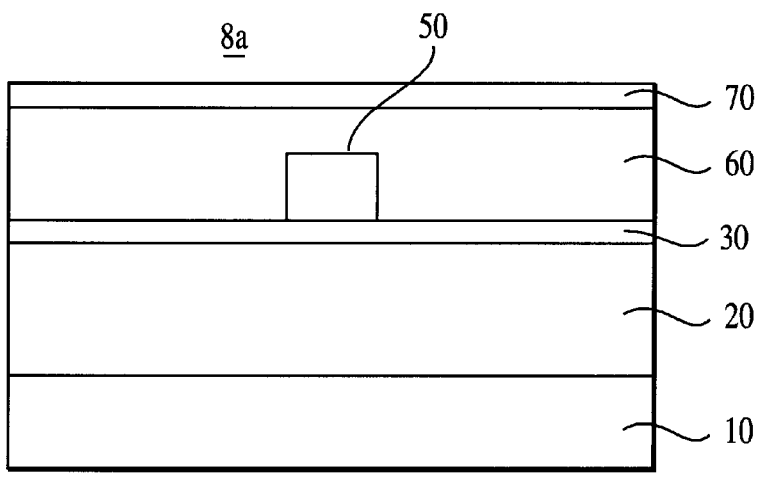
FIG. 2 shows a preferred structure loaded waveguide diode laser to which the present invention is applicable.

A preferred particular structure is a modification of the general FIG. 1 structure, a case where the confining layer 40 is chosen to have zero thickness (it is omitted) and the rib loading layer 50 is immediately adjacent to the active region 30. This type of semiconductor laser 8a is shown in FIG. 2. The layers in the FIG. 2 semiconductor laser 8a otherwise bear the same characteristics and reference numerals as the FIG. 1 semiconductor laser 8.

Figure 3:
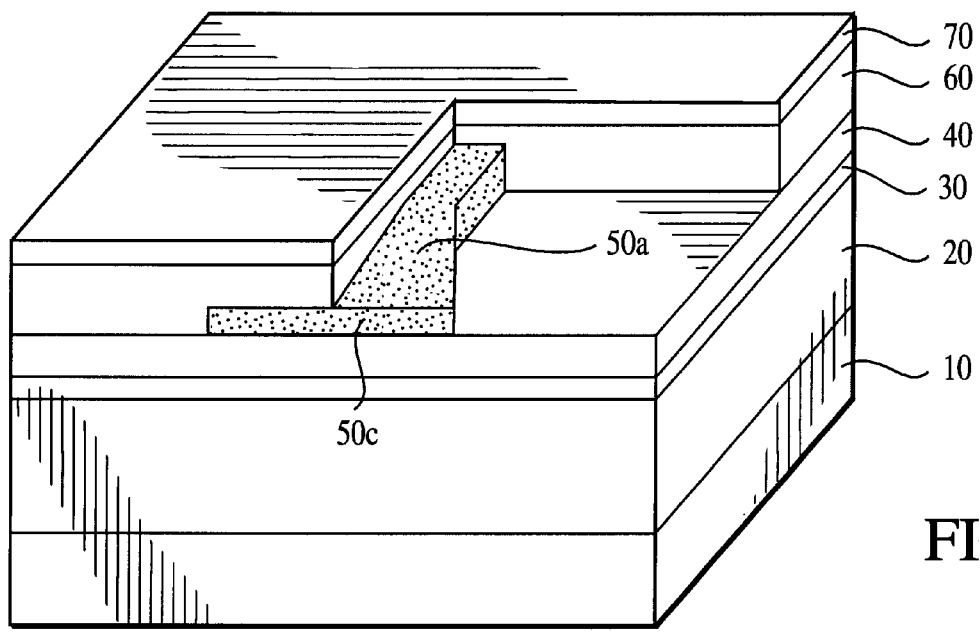
FIG. 3 is a partial cross section of a semiconductor laser according to the present invention.
Figure 4:
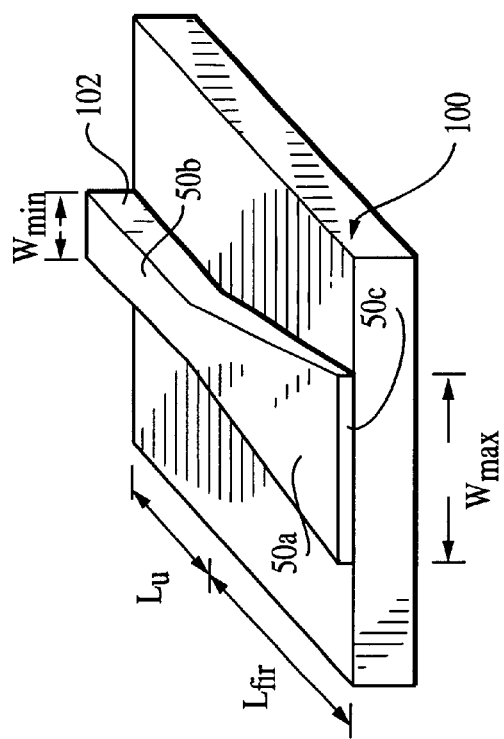
FIG. 4 is a perspective view of the flared and tapered rib-loading waveguide structure of FIG. 1.

Central to the invention is the geometry of the rib loading layer 50. As seen in FIGS. 3 and 4, the rib loading layer 50 includes a flared and tapered portion 50a, that extends from a uniform portion 50b to a wide end 50c of the rib loading layer 50. The subject of this invention is a flare-pattern rib loading structure, shown in FIG. The uniform portion 50b has length, $L_u$ with a constant width, $W_{min}$. These parameters are selected, in concert with the other structural composition and thickness parameters of a semiconductor laser to form a single fundamental mode rib-loaded laser waveguide, as is known in the art. According to the present invention, there is also a tapered (and flared) portion 50a of length, $L_{flr}$, over which the width of the rib increases to a value of $W_{max}$ and the thickness decreases. The actual shape of the flare can take a number of different forms including linear, exponential, raised-cosine, etc. The relationship between the thickness and width of the flare at any point must be maintained such that the waveguide only supports the fundamental lateral optical waveguide mode. Though a single end of the waveguide is shown as being wide, the invention is also realized with two flared ends and a central region of generally uniform width and thickness.

The basic flared and tapered waveguide structure of the invention can be incorporated in any semiconductor laser irrespective of the materials or structure of the active region. The following fabrication discussion is therefore exemplary, and concerns the semiconductor laser structure shown in FIGS. 1 and 2. The preferred method for fabricating the semiconductor laser having such structure is a selective area MOCVD growth process using a flared mask geometry to obtain an appropriate complementary relationship between the thickness of an active region transverse waveguide geometry, or the thickness of a rib-loaded waveguide geometry, and the varying lateral width of the waveguide such that fundamental spatial mode operation of a semiconductor semiconductor laser is maintained. Selective area epitaxy by MOCVD results when a dielectric mask is used for growth inhibition in the masked regions. Because most of the usual species used for MOCVD growth will not adhere to, or grow on, a dielectric mask, they will diffuse on the surface or in the gas phase away from the masked regions and into unmasked regions. As a result, no growth occurs in masked regions and a corresponding, predictable increase in the thickness of selectively grown layers is observed in any unmasked regions in the vicinity of the dielectric mask.

Figure 5:
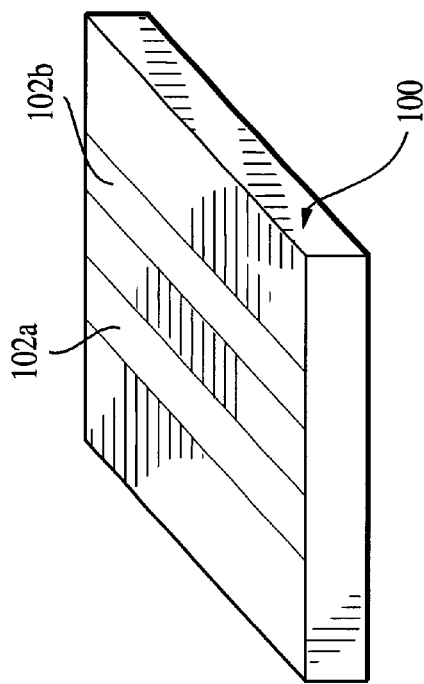
FIG. 5 shows a substrate suitable for selective area growth to produce the semiconductor laser of FIG. 1.
Figure 6:
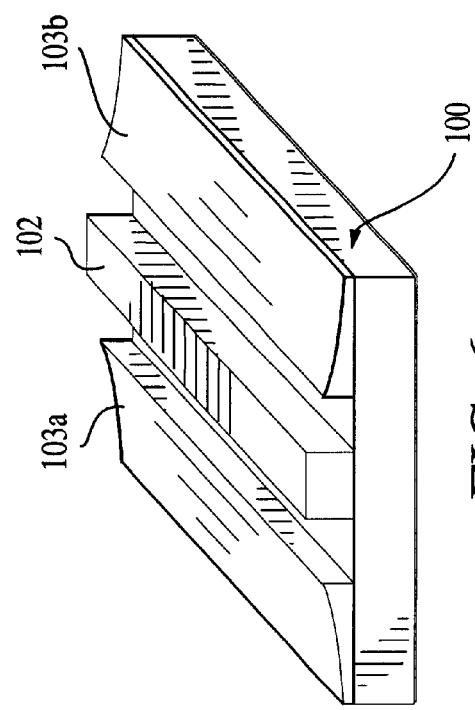
FIG. 6 shows a result of a selective area epitaxial growth using the substrate of FIG. 3.

In the simplest case, a dual stripe mask pattern is used as shown in FIG. 5. A dual strip dielectric mask 102a, 102b is used with substrate 100 suitable for selective area epitaxial growth. This has two results. First, there is no epitaxial material grown in the masked regions. This allows the diode laser designer to use the width of the opening between the masked regions to define the width of the laser lateral waveguide—the core of the lateral waveguide. Second, the growth rate in the opening between the masked regions depends on both the supply rate of growth constituents and the width of the mask stripes, and is enhanced in the open region between the stripes. The result is shown in FIG. 6, where 102 is the enhanced growth in the open area between the dielectric mask 102a, 102b, and layers 103a, 103b grown outside the mask which show enhancement that diminishes away from the dielectric mask 102a, 102b. Thus, selective MOCVD allows the designer to choose any layer thickness, within limits, for the central part of the structure. This can be used to define the refractive index step between the core of the lateral waveguide and the surrounding regions. The width of the rib is determined by the opening between the stripes in the dielectric film mask shown in FIG. 5. The widths of the dielectric stripes are determined by the growth process, such that the thickness of the grown waveguide rib-loading layer is of appropriate thickness for the width of the waveguide at that point. Provided that the goal is fundamental mode diode laser operation, there is a relationship, well known in basic laser texts, connecting the maximum effective refractive index difference between the center and sides of the lateral waveguide with the width of the lateral waveguide. The effective refractive index ($\Lambda$n) at any lateral point in a multi-layer structure is determined by the composition (material index of refraction) of the layers comprising the structure in proportion to the shape of the optical field As the width of the lateral waveguide is increased, the maximum effective refractive index difference, $\Delta$n, for fundamental mode operation also decreases. The well known relationship between the effective lateral index step and width necessary to support fundamental lateral mode laser operation will define the acceptable variations in width compared to thickness.

Figure 7:
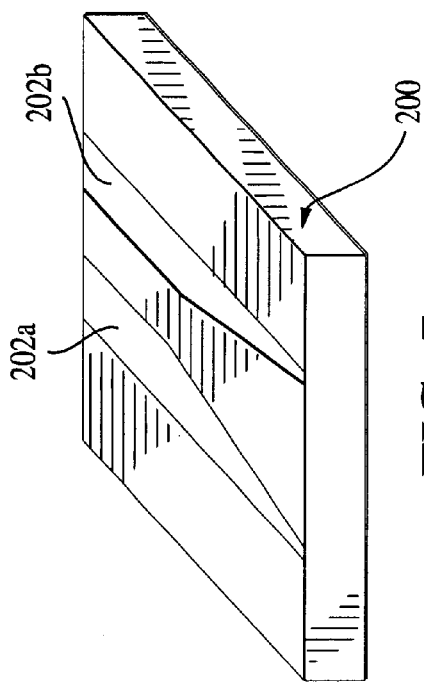
FIG. 7 shows an exemplary mask pattern for forming a flared and tapered waveguide of the invention in a semiconductor laser structure.

In fabrication of a semiconductor laser of the invention, a mask including two flared stripe-shaped films 202a, 202b having an opening width at the narrow end of $W_{min}$ and increasing with some profile over a distance $L_{flare}$ to an opening width at the wide end of $W_{max}$ are used, as shown in FIG. 7., where 201 is some substrate suitable for selective area epitaxial growth.

One key aspect of the mask pattern is that the flared loading rib must get thinner as the flare becomes wider. To accomplish this the width of the dielectric stripes 202a, 202b will change as the flare gets wider. The stripes 202a, 202b will usually get narrower as the flare becomes wider but this will not necessarily be always the case.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A semiconductor laser geometry including a rib loading waveguide, the rib loading waveguide having a wide end, the rib loading waveguide being substantially uniform in thickness and width over a uniform portion of its length and having a flared portion which gradually increases in width and decreases in thickness from said uniform portion to said wide end, the width and thickness of the rib supporting fundamental lateral mode laser operation throughout the uniform portion and the flared portion.

2. The semiconductor laser geometry according to claim 1, wherein the gradual increase in width of the flared portion is linear.

3. The semiconductor laser geometry according to claim 2, wherein the gradual decrease in thickness of the flared portion is a function of the gradual increase in width.

4. The semiconductor laser geometry according to claim 1, wherein the gradual increase in width is exponential.

5. The semiconductor laser geometry according to claim 1, wherein said uniform portion and said flared portion are within an active region of the semiconductor laser geometry.

6. The semiconductor laser geometry according to claim 1, wherein said uniform portion and said flared portion are above and adjacent an active region of the semiconductor laser geometry.

* * * * *